(12) United States Patent
Okumura

(10) Patent No.: US 9,978,593 B2
(45) Date of Patent: May 22, 2018

(54) PLASMA PROCESSING DEVICE, PLASMA PROCESSING METHOD AND MANUFACTURING METHOD OF ELECTRONIC DEVICE

(71) Applicant: Panasonic Intellectual Property Management Co., Ltd., Osaka (JP)

(72) Inventor: Tomohiro Okumura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days. days.

(21) Appl. No.: 15/462,642

(22) Filed: Mar. 17, 2017

(65) Prior Publication Data

US 2017/0287712 A1 Oct. 5, 2017

(30) Foreign Application Priority Data

Mar. 29, 2016 (JP) .................. 2016-065329

(51) Int. Cl.
*H01L 21/02* (2006.01)
*H01J 37/32* (2006.01)

(52) U.S. Cl.
CPC ...... *H01L 21/02689* (2013.01); *H01J 37/321* (2013.01); *H01J 37/3211* (2013.01); *H01J 37/32339* (2013.01); *H01J 37/32449* (2013.01); *H01L 21/02532* (2013.01); *H01L 21/02595* (2013.01); *H01J 2237/334* (2013.01)

(58) Field of Classification Search
CPC ............ H01J 37/321; H01J 37/3211; H01J 37/32119; H01J 37/32128; H01J 37/32137; H01J 37/32146; H01J 37/32155; H01J 37/32165; H01J 37/32174
See application file for complete search history.

(56) References Cited

U.S. PATENT DOCUMENTS

2013/0115780 A1  5/2013  Okumura et al.
2014/0220784 A1  8/2014  Okumura et al.

FOREIGN PATENT DOCUMENTS

| JP | 2013-120633 | 6/2013 |
|---|---|---|
| JP | 2013-120684 | 6/2013 |
| JP | 2013-120685 | 6/2013 |

OTHER PUBLICATIONS

T.Okumura and H.Kawaura, "Elongated Inductively Coupled Thermal Plasma Torch Operable at Atmospheric Pressure", Jpn. J. Appl. Phys. 52(2013) 05EE01.

*Primary Examiner* — Sonya D McCall Shepard
(74) *Attorney, Agent, or Firm* — Panasonic IP Management; Kerry S. Culpepper

(57) ABSTRACT

A plasma processing device, a plasma processing method and a manufacturing method of an electronic device with excellent uniformity, are capable of performing heating and high-speed processing for a short period of time as well as controlling the distribution of heating performances in a linear direction (amounts of heat influx to a substrate). In an inductively-coupled plasma torch unit, coils, a first ceramic block and a second ceramic block are arranged, and a chamber has an annular shape. A plasma P is applied to a substrate at an opening of the chamber. The chamber and the substrate are relatively moved in a direction perpendicular to a longitudinal direction of the opening. Plural gas jetting ports jetting a gas toward a substrate stage are provided side by side in a direction of a line formed by the opening, thereby controlling the distribution of heating performances in the linear direction and realizing plasma processing with excellent uniformity.

11 Claims, 7 Drawing Sheets

PLASMA PROCESSING DEVICE, PLASMA PROCESSING METHOD AND MANUFACTURING METHOD OF ELECTRONIC DEVICE

TECHNICAL FIELD

The technical field relates to a plasma processing device, a plasma processing method and a manufacturing method of an electronic device.

BACKGROUND

A semiconductor thin film of polycrystalline silicon (poly-Si) and so on is widely used for a thin-film transistor and a solar cell. As a method of forming the semiconductor thin film inexpensively, there is a method in which an amorphous silicon film is irradiated with a laser light to crystallize the film. The laser process can be applied to activation of impurity atoms introduced to a semiconductor substrate by ion implantation or plasma doping. However, there are problems that the attaining temperature varies due to the amount of light absorption of an object to be heated and that a joint is generated in the laser annealing technique, and extremely expensive equipment is necessary.

In response to the above, a technique in which a linear thermal plasma is generated in the vicinity of the substrate, and scanning is performed only in one direction to thereby perform heating not depending on light absorption of the object to be heated and realize thermal treatment seamlessly and inexpensively is considered (for example, refer to JP-A 2013-120633: (Patent Document 1), JP-A 2013-120684 (Patent Document 2), JP-A 2013-120685 (Patent Document 3)) and Non-Patent Document 1).

[Non-Patent Document 1] T. Okumura and H. Kawaura, Jpn, J. Appl. Phys, 52 (2013) 05EE01

SUMMARY

However, in the technique of generating the linear thermal plasma described in Patent Documents 1 to 3 as shown in related art, there is a problem that it is difficult to control the distribution of heating performances in a linear direction (amounts of heat influx to the substrate) in an application of performing high-temperature treatment of the vicinity of the substrate surface for a short period of time such as crystallization of semiconductor. Therefore, there is a problem that uniformity of temperature and so on is hot good according to this case.

The present disclosure has been made in view of the above problems, and an object thereof is to provide a plasma processing device, a plasma processing method and a manufacturing method of an electronic device with excellent uniformity, which are capable of controlling the distribution of heating performances in a linear direction (amounts of heat influx to the substrate) at the time of performing high-temperature heat treatment on the vicinity of the substrate surface just for a short period of time or at the time of performing low-temperature plasma processing on the substrate by irradiating the substrate with plasma generated by a reactant gas or with plasma and the reactant gas flow at the same time.

A plasma processing device according to an embodiment of the present disclosure using an inductively-coupled plasma torch includes an annular chamber having a linear-shaped opening and communicating with the opening, which is surrounded by dielectric members except for the opening, gas supply pipes introducing a gas into the chamber, coils provided in the vicinity of the chamber, a high-frequency power source connected to the coils and a substrate mounting table, in which plural gas jetting ports from which the gas is jetted toward the substrate mounting table are provided side by side in a direction of a line formed by the opening in the vicinity of the opening.

According to the structure, it is possible to realize the plasma processing device with excellent uniformity, which is capable of controlling the distribution of heating performances in a linear direction (amounts of heat influx to the substrate).

It is preferable that the plasma processing device according to the embodiment of the disclosure further includes gas flow rate controllers controlling flow rates of the gas supplied to the plural gas jetting ports independently of one another.

According to the structure, the distribution of heating performances in the linear direction (amounts of heat influx to the substrate) can be controlled more precisely.

It is preferable that the plasma processing device includes a gas supply pipe for introducing the gas toward a portion other than the opening of the chamber separately from the gas supply pipes introducing the gas to the plural gas jetting ports.

According to the structure, plasma can be generated more stably.

It is preferable that a portion forming a surface facing the substrate mounting table in the dielectric members surrounding the chamber is formed of a cylinder arranged in parallel to the line direction of the opening.

According to the structure, plasma processing can be realized at higher speed.

If is further preferable that the plasma processing device further includes a rotating mechanism for rotating the cylinder around an axis of the cylinder.

According to the structure, plasma processing can be realized at higher speed.

If is preferable that the gas flows toward the plural gas jetting ports through spaces between concave portions provided in the cylinder and the dielectric members supporting the cylinder.

According to the structure, plural gas jetting ports can be provided side by side in the direction of the line formed by the opening with a simple structure.

The gas may flow toward the plural gas jetting ports through spaces between the cylinder and concave portions provided in the dielectric member supporting the cylinder.

According to the structure, more uniform processing can be realized.

A plasma processing method according to an embodiment of the present disclosure which uses an inductively-coupled plasma torch including the steps of letting a gas from a linear-shaped opening communicating with a chamber toward a substrate while supplying the gas into the annular chamber surrounded by dielectric members, generating a high-frequency electromagnetic field inside the chamber by supplying high-frequency power to coils to generate plasma, and processing the surface of the substrate, in which the processing is performed while jetting the gas toward the substrate from plural gas jetting ports provided side by side in a direction of a line formed by the opening in the vicinity of the opening.

According to the structure, it is possible to realize the plasma processing method with excellent uniformity, which is capable of controlling the distribution of heating performances in a linear direction (amounts of heat influx to the substrate).

A manufacturing method of an electronic device according to an embodiment of the disclosure uses the plasma processing method according to claim 8.

According to the structure, it is possible to realize the manufacturing method of the electronic device with excellent uniformity, which is capable of controlling the distribution of heating performances in a linear direction (amounts of heat influx to the substrate).

According to the present disclosure, the distribution of heating performances in the linear direction (amounts of heat influx to the substrate) can be controlled as uniform processing can be realized at the time of performing high-temperature heat treatment on the vicinity of the substrate surface just for a short period of time or at the time of performing low-temperature plasma processing on the substrate by irradiating the substrate with plasma generated by a reactant gas or with plasma and the reactant gas flow at the same time.

DESCRIPTION OF EMBODIMENTS

Hereinafter, a plasma processing device according to embodiments of the present disclosure will be explained with reference to the drawings.

Embodiment 1

Hereinafter, Embodiment 1 of the present disclosure will be explained with reference to FIGS. 1A and 1B to FIG. 3.

Figure 1A:
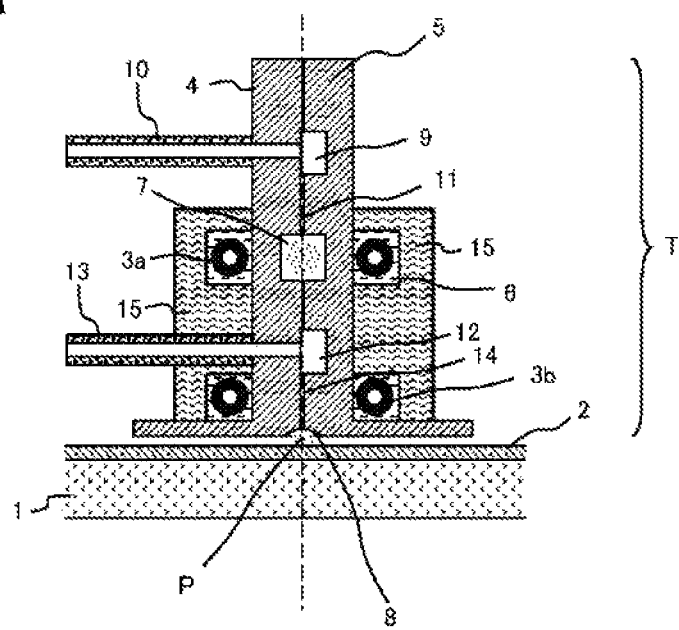
FIGS. 1A and 1B are cross-sectional views showing a structure of a plasma processing device according to Embodiment 1 of the present disclosure.
Figure 1B:
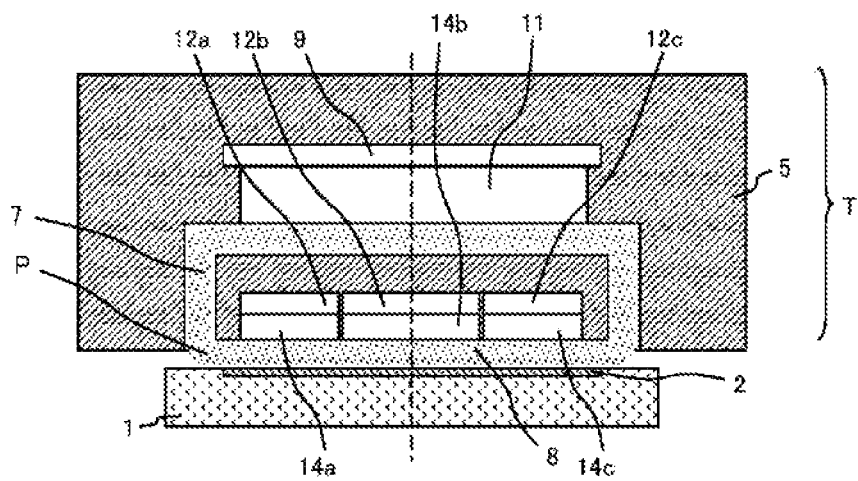

FIG. 1A shows a structure of a plasma processing device according to Embodiment 1 of the present disclosure, which is a cross-sectional view of an inductively-coupled plasma torch unit T taken along a surface perpendicular to a linear direction formed by an opening 8. FIG. 1B is a cross-sectional view of the inductively-coupled plasma torch unit T taken along a surface parallel to the linear direction formed by the opening 8 as well as perpendicular to a substrate.

Figure 2:
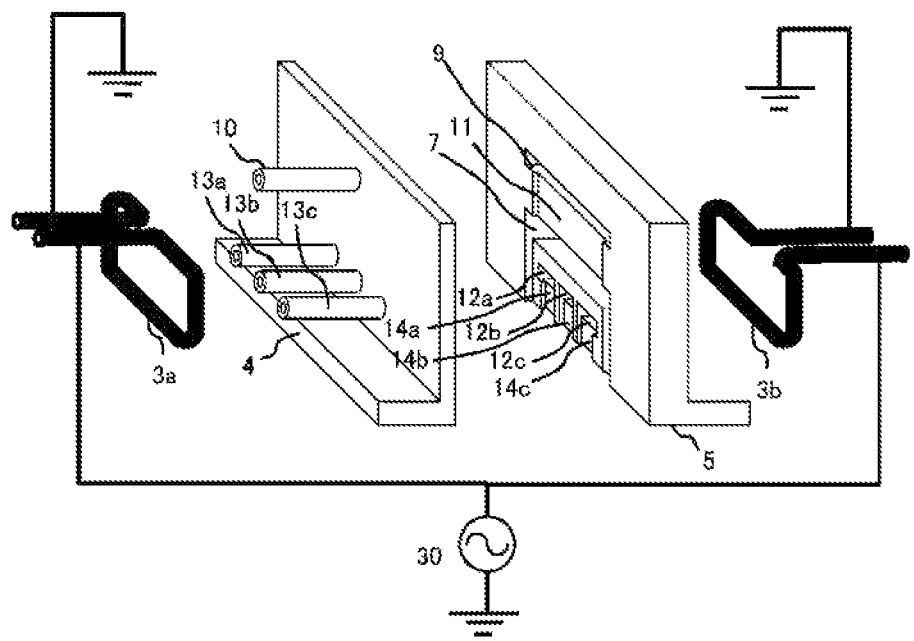
FIG. 2 is a perspective view showing a structure of the plasma processing device according to Embodiment 1 of the present disclosure.
Figure 3:
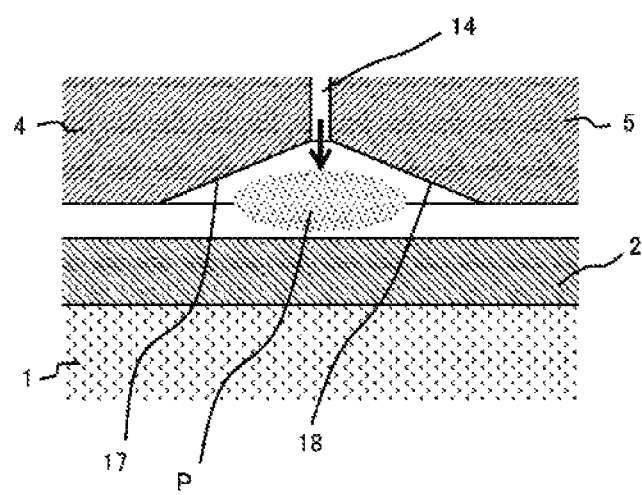
FIG. 3 is an enlarged cross-sectional view showing a vicinity of an opening according to Embodiment 1 of the present disclosure.

FIG. 1A is a cross-sectional view taken along a broken line of FIG. 1B, and FIG. 1B is a cross-sectional view taken along a broken line of FIG. 1A. FIG. 2 is an assembly configuration diagram of the inductively-coupled plasma torch unit T shown in FIGS. 1A and 1B, in which perspective views of (parts of) respective components are aligned. FIG. 3 is an enlarged cross-sectional view showing a vicinity of the opening 8 in FIG. 1.

In FIGS. 1A, 1B and FIG. 2, a substrate 2 is mounted on a substrate stage 1 as a substrate mounting table. In the inductively-coupled plasma torch unit T, coils 3a and 3b formed of a conductor are arranged in the vicinity of a first ceramic block 4 and a second ceramic block 5 formed of a dielectric. The coils 3 are copper tubes having a circular cross section. A chamber 7 formed of a dielectric is demarcated by a space surrounded by the first ceramic block 4, the second ceramic block 5 and a surface of the substrate 2.

The chamber 7 is provided along a surface perpendicular to a surface formed by the substrate stage 1. The coils 3a and 3b are formed so that central axes thereof are parallel to the substrate stage 1 as well as perpendicular to a plane including the chamber 7. That is, surfaces formed by windings of the coils 3a and 3b are provided along the surface perpendicular to the surface formed by the substrate stage 1 as well as along the plane including the chamber 7.

The inductively-coupled plasma torch unit T is surrounded by a shield member (not shown) formed of a conductor which is entirely grounded, which can effectively prevent high-frequency leakage (noise) as well as effectively prevent undesirable abnormal discharge.

The chamber 7 is surrounded by one plane of the first ceramic block 4 and a groove provided in the second ceramic block 5. The two dielectric blocks as these dielectric members are adhered to each other. That is, the chamber 1 is surrounded by the dielectric except for the opening 8.

Moreover, the chamber 7 has an annular shape. The annular shape in this case indicates a closed continuous string-like shape and is not limited to a circular shape. In the embodiment, the chamber 7 having a rectangular shape (the closed continuous string-like shape in which two straight line portions forming long sides and two straight lines forming short sides connected to both ends of the long sides) is shown. A plasma P generated in the chamber 7 contacts the surface of the substrate 2 in a long linear-shaped opening 8 in the chamber 7. A longitudinal direction of the chamber 7 and a longitudinal direction of the opening 8 are arranged in parallel.

A first manifold 9 is provided inside the second ceramic block 5. A gas supplied from a first gas supply pipe 10 to the first gas manifold 9 is introduced into the chamber 7 through a first gas supply hole 11 (through hole) as a gas introducing part provided in the second ceramic block 5. According to the structure, a gas flow which is uniform in the longitudinal direction can be easily realized. A flow rate of the gas introduced into the first gas supply pipe 10 is controlled by providing a flow rate controller such as a mass flow controller on the upstream side thereof.

Second gas manifolds 12a, 12b and 12c are provided inside the second ceramic block 5. A gas supplied from the second gas manifolds 12a, 12b and 12c respectively from second gas supply pipes 13a, 13b and 13c is introduced into the vicinity of the opening 8 through second gas supply holes 14a, 14b and 14c (through holes) as gas introducing parts respectively provided in the second ceramic block 5.

That is, the lowest portions of the second gas supply holes 14a, 14b and 14c are gas jetting ports from which the gas is jetted from the inductively-coupled plasma torch unit T toward the substrate stage 1. Namely, plural gas jetting ports from which the gas is jetted toward the substrate stage 1 are provided in the vicinity of the opening 8 side by side in a direction of a line formed by the opening 8. Flow rates of the gas to be introduced into the second gas supply pipes 13a, 13b and 13c are controlled independently of one another by providing flow rate controllers such as mass flow controllers on the upstream side of respective pipes.

Both of the first gas supply hole 11 and the second gas supply holes 14 are long slits, however, plural circular holes may be provided in the longitudinal direction. It is also possible to prevent discharge inside the first gas manifold 9 and the second gas manifolds 12 by arranging porous ceramic inside the first gas manifold 9 and the second gas manifolds 12.

Coolant flow paths are formed inside the coils 3a and 3b. The coils 3a and 3b are arranged inside water conduits 6 as coolant flow paths surrounded by grooves provided in a ceramic cover 15, the first ceramic block 4 and the second ceramic block 5. The coils 3a and 3b, the first ceramic block 4 and the second ceramic block 5 can be cooled by allowing a coolant such as water to flow in the water conduits 6.

The coils 3a and 3b are separately arranged on the outside of the first ceramic block 4 and the outside of the second ceramic block 5 and are connected in parallel at positions separated from the chamber 7, so that directions of high-frequency electromagnetic fields generated in the chamber 7 are equal to each other when the high-frequency power is applied. Although any one of the two coils 3a and 3b can function as the coil, there is an advantage that the intensity of the electromagnetic field to be generated in the chamber 7 can be increased by providing two coils with the chamber 7 interposed therebetween as in the embodiment.

The rectangular linear-shaped opening 8 is provided, and the substrate 2 is arranged to face the opening 8. The high-frequency power of, for example, 13.56 MHz is supplied to the coils 3a and 3b from a not-shown high-frequency power source while supplying the gas into the chamber 7 in advance and while jetting the gas from the opening 8, thereby generating the plasma P in the chamber 7, after that, the substrate 2 is moved to the vicinity of the inductively-coupled plasma torch unit T and the surface of the substrate 2 is exposed to the plasma near the opening 8 to thereby perform plasma processing on the substrate 2.

The chamber 7 and the substrate stage 1 are relatively moved in the direction perpendicular to the direction of the line formed by the opening 8, thereby performing processing on the substrate 2. That is, the inductively-coupled plasma torch unit T or the substrate stage 1 is moved in a right and left direction of FIG. 1A and a direction perpendicular to the sheet of FIG. 1B.

Various types of gases may be used as the gas to be supplied into the chamber 7, however, gases mainly containing an inert gas are desirable in consideration of the stability and ignitability of plasma and lifetimes of members exposed to plasma. Among them, Ar gas is typically used. When plasma is generated only by Ar gas, the plasma will be quite high in temperature (10,000K or more). Plasma with a further higher temperature can be obtained by adding a slight amount of gas.

As conditions for generating plasma, the following values are approximately suitable: a scanning speed=50 to 3000 mm/s; the total gas flow rate=1 to 100 SLM; an $H_2$ concentration in Ar+$H_2$ gas=0 to 10%; and the high-frequency power=0.5 to 50 kW. In these various amounts, values per a length 100 mm of the opening 8 are shown about the gas flow rate and the power. That is because it is suitable that amounts in proportion to the length of the opening 8 are inputted in parameters such as the gas flow rate and the power.

As shown in FIG. 3, a surface 17 of the opening 8 in the first ceramic block 4 which faces the substrate stage 1 and a surface 18 of the second ceramic block 5 which faces the substrate stage 1 are inclined with respect to the surface formed by the substrate stage 1, so that the opening 8 has a shape widened toward the substrate stage 1.

In the above structure, the plasma P easily remains at the center of the opening 8 in the right and left direction. Because, a distance between the surface of the opening 8 which faces the substrate stage 1 as a wall contacted by the plasma P and the substrate 2 is broadest at the center of the opening 8, a force of returning to the original center functions on the plasma as an energy state is increased when the plasma moves a little in the right and left direction. That is, the swing of plasma is suppressed and stable plasma processing can be realized by the above structure.

Furthermore, the plasma P can be pushed toward the substrate 2 by jetting the gas from the second gas supply holes 14 in an arrow direction (downward) in the drawing in the vicinity of the opening 8. This means that the plasma P goes away from the surface of the opening 8 facing the substrate stage 1, therefore, the dielectric member is hardly damaged even when the high power is supplied, which can realize plasma processing capable of performing high-speed processing.

The above structure permits the plasma P to come closer to the substrate 2 as compared with a case where the gas is not jetted downward from the second gas supply holes 14, therefore, the surface of the substrate 2 can be processed with a higher temperature even when being operated with the same power, which can realize plasma processing capable of performing high-speed processing.

Moreover, according to the structure where plural gas jetting ports from which the gas is jetted toward the substrate stage 1 are provided side by side in the direction of the line formed by the opening 8 in the vicinity of the opening 8, the flow rates of the gas jetting from respective gas jetting ports are controlled independently of one another by the flow rate controllers such as mass flow controllers in respective systems. Accordingly, the distribution of heating performances (amounts of heat influx to the substrate) in the direction of the line formed by the opening 8 can be controlled and the plasma processing device with excellent uniformity can be realized.

In the embodiment, the first gas supply pipe 10 for introducing the gas toward a portion other than the opening 8 in the chamber 7 is provided separately from the second gas supply pipes 13a, 13b and 13c for introducing the gas to plural gas jetting ports. Although the introduced gas is easily diffused from a gap between the inductively-coupled plasma torch unit T and the substrate 2 in the vicinity of the opening 8, the gas introduced into the chamber 7 from the first gas supply pipe 10 through the first gas manifold 9 and the first gas supply hole 11 flows from an upper part to a lower part in FIGS. 1A-1B inside the chamber 7, then, reaches a space between the inductively-coupled plasma torch unit T and the substrate 2 near both sides of the opening 8. As described above, the flowing manner of the gas differs in a path through which the gas is introduced to the plural gas jetting ports and a path through which the gas is introduced to the portion other than the opening 8 in the chamber 7. Accordingly, the plasma can be generated more stably by providing different gas supply paths respectively and controlling the flow rates of these paths independently as in the embodiment.

The case where the surface 17 of the opening 8 in the first ceramic block 4 which faces the substrate stage 1 and the surface 18 of the second ceramic block 5 which faces the substrate stage 1 are inclined with respect to the surface formed by the substrate stage 1 has been cited as an example. The present disclosure is not limited to the example, and even when the surface 17 of the opening 8 in the first ceramic block 4 which faces the substrate stage 1 and the surface 18 of the second ceramic block 5 which faces the substrate stage 1 are parallel to the surface formed by the substrate stage 1, the heating performance in the linear direction can be naturally controlled as long as plural gas jetting ports from which the gas is jetted toward the substrate stage 1 are provided side by side in the direction of the line formed by the opening 8.

Embodiment 2

Hereinafter, Embodiment 2 of the present disclosure will be explained with reference to FIG. 4.

Figure 4:
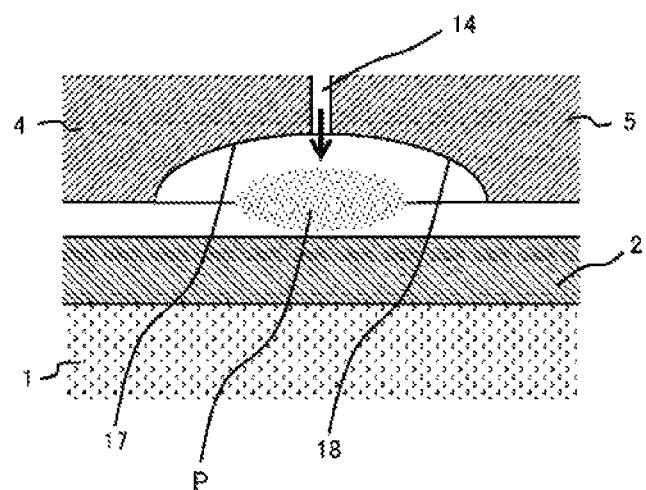
FIG. 4 is an enlarged cross-sectional view showing a vicinity of an opening according to Embodiment 2 of the present disclosure.

FIG. 4 shows a structure of a plasma processing device according to Embodiment 2 of the present disclosure, which is an enlarged cross-sectional view showing the vicinity of the opening 8 in a cross-sectional view taken along a surface perpendicular to the direction of the line formed by the opening 8 in the inductively-coupled plasma torch unit T, corresponding to FIG. 3 of Embodiment 1.

As shown in FIG. 4, the surface 17 of the opening 8 in the first ceramic block 4 which faces the substrate stage 1 and the surface 18 of the second ceramic block 5 which faces the substrate stage 1 are inclined with respect to the surface formed by the substrate stage 1, and they make a semi-cylindrical shape as a whole.

The surface 17 of the opening 8 in the first ceramic block 4 which faces the substrate stage 1 and the surface 16 of the second ceramic block 5 which faces the substrate stage 1 are both elliptical arcs. Also in the case of such shape, the opening 8 is formed to have a shape widened toward the substrate stage 1. Also according to the structure, the plasma P easily remains at the center of the opening 8 in the right and left direction, the swing of plasma is suppressed and stable plasma processing can be realized. Furthermore, the plasma P can be pushed toward the substrate 2 by jetting the gas from the second gas supply holes 14 in an arrow direction (downward) in the drawing in the vicinity of the opening 8.

Embodiment 3

Hereinafter, Embodiment 3 of the present disclosure will be explained with reference to FIG. 5A to FIG. 9.

Figure 5A:
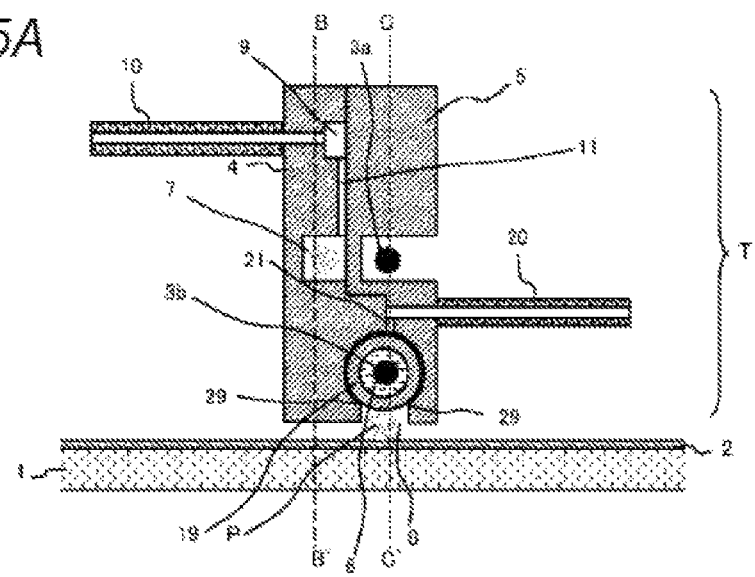
FIGS. 5A to 5C are cross-sectional views showing a structure of a plasma processing device according to Embodiment 3 of the present disclosure.
Figure 5B:
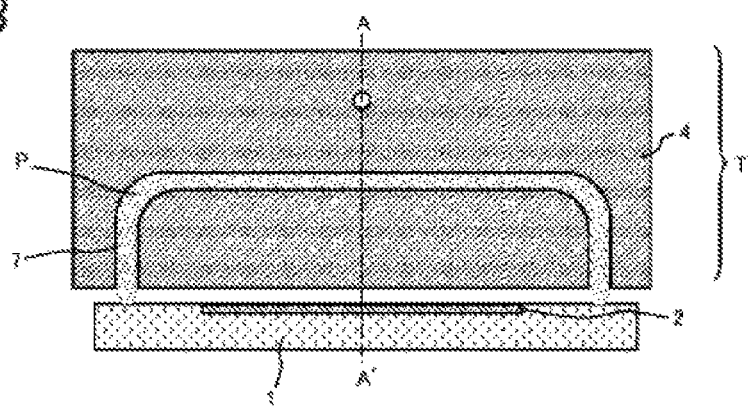
Figure 5C:
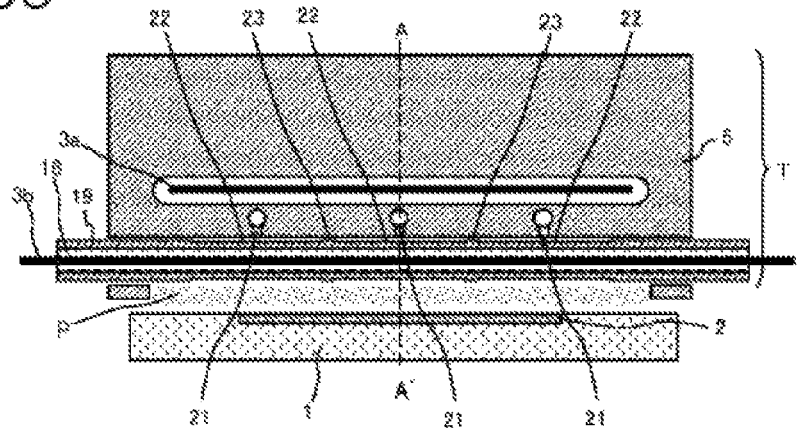
Figure 6:
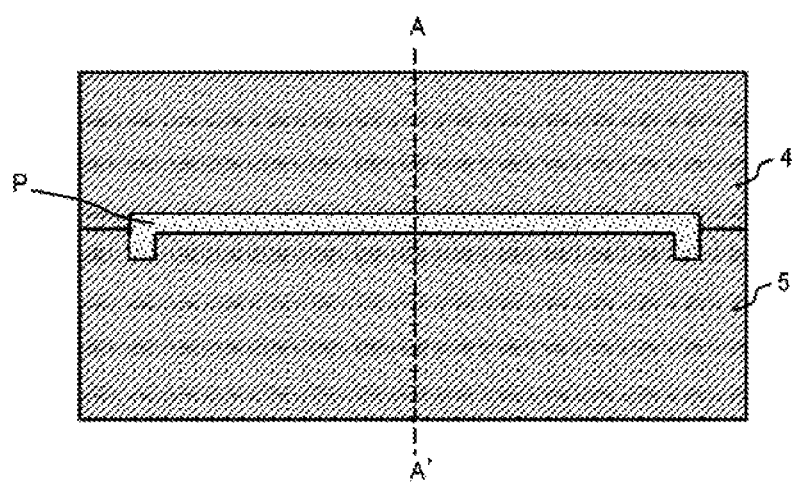
FIG. 6 is a plan view showing the structure of the plasma processing device according to Embodiment 3 of the present disclosure.
Figure 7:
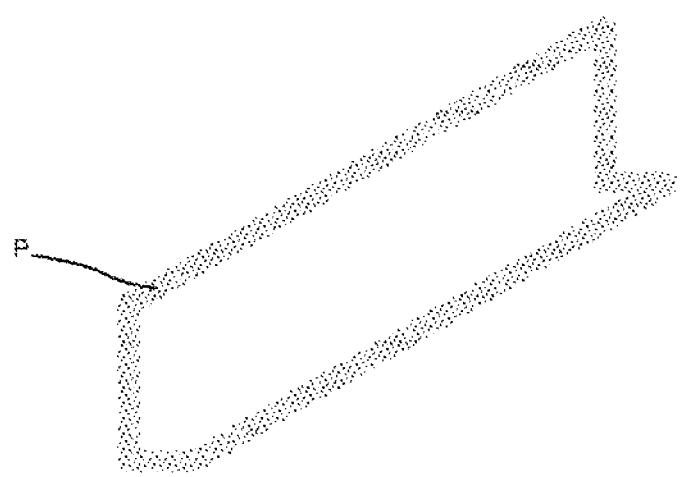
FIG. 7 is a perspective view showing a plasma generation area according to Embodiment 3 of the present disclosure.
Figure 8:
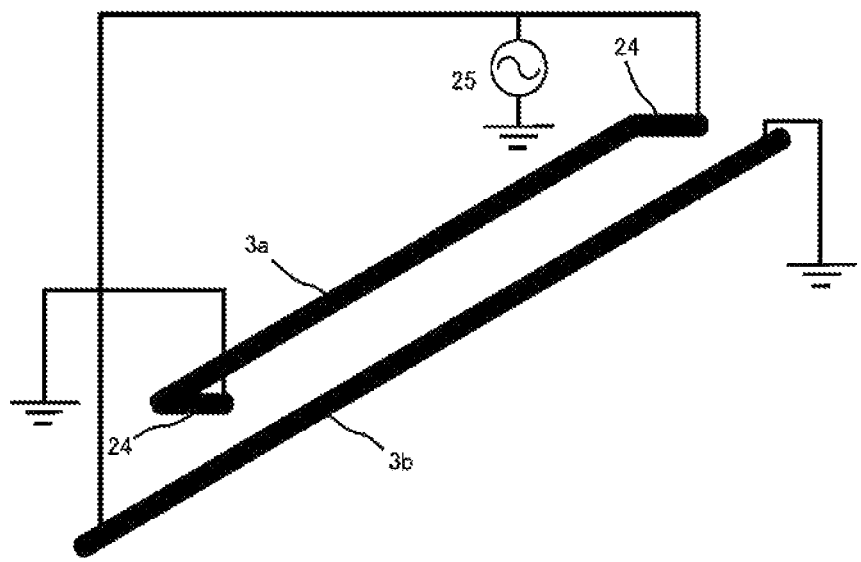
FIG. 8 is a perspective view showing a structure of coils according to Embodiment 3 of the present disclosure.
Figure 9:
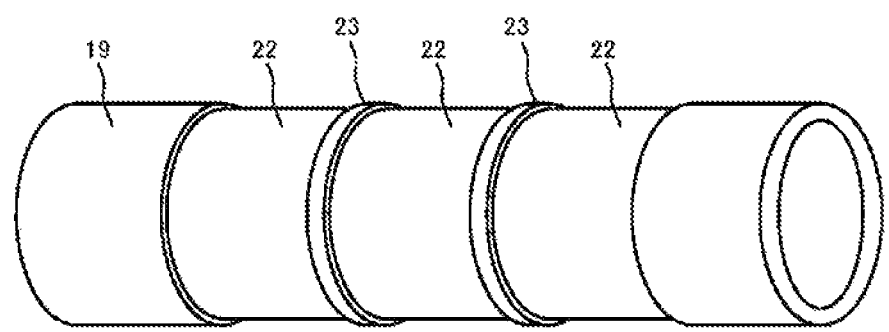
FIG. 9 is a perspective view showing a structure of a ceramic tube according to Embodiment 3 of the present disclosure.

FIG. 5A shows a structure of a plasma processing device according to Embodiment 3 of the present disclosure, which is a cross-sectional view taken along a surface perpendicular to a direction of the line formed by the opening 8 as well as passing through a dotted line A-A' shown in FIGS. 5B, 5C and FIG. 6 in the inductively-coupled plasma torch unit T. FIGS. 5B and 5C are cross-sectional views taken along a surface parallel to the line direction formed by the opening 8 as well as passing through dotted lines of FIG. 5A in the inductively-coupled plasma torch unit T. FIG. 5B is a cross-sectional view taken along a dotted line B-B' of FIG. 5A, and FIG. 5C is a cross-sectional view taken along a dotted line C-C' of FIG. 5A. FIG. 6 is a plan view obtained by seeing the inductively-coupled plasma torch unit T shown in FIGS. 5A-5B from a lower part to an upper part in FIGS. 5A-5B. FIG. 7 is a perspective view showing a plasma generation area, which is a view obtained by seeing an obliquely lower direction from the right front of FIG. 5A. FIG. 8 is a perspective view showing a structure of coils, which is a view obtained by seeing an obliquely lower direction from the right front of FIG. 5A in the same manner as FIG. 7. FIG. 9 is a perspective view showing a structure of a ceramic tube, which is a view obtained by seeing an obliquely left direction from the right front of FIG. 5C.

In FIGS. 5A-5B, the substrate 2 is mounted on the substrate stage 1 as a substrate mounting table. In the inductively-coupled plasma torch unit T, coils 3a and 3b formed of a conductor are arranged in the vicinity of a long and annular chamber 7 demarcating a space surrounded by the first ceramic block 4, the second ceramic block 5 and the substrate 2. More specifically, the coils 3 (3a and 3b) both have a linear shape. The coil 3a arranged on a side distant from the substrate stage 1 is arranged in a groove provided in the second ceramic block 5, and the coil 3b on a side closer to the substrate stage 1 is arranged inside a ceramic tube 19. The coils 3a, 3b and the chamber 7 are arranged along a surface approximately perpendicular to a surface formed by the substrate stage 1.

The inductively-coupled plasma torch unit T is surrounded by a shield member (not shown) formed of a conductor which is entirely grounded, which can effectively prevent high-frequency leakage (noise) as well as effectively prevent undesirable abnormal discharge.

The chamber 7 is surrounded by an annular groove in which grooves provided in the first ceramic block 4 and the second ceramic block 5 are continuously formed. That is, the entire chamber 7 is surrounded by a dielectric. The chamber 7 is an annular shape. The annular shape in this case indicates a closed continuous string-like shape. In the embodiment, the chamber 7 has the closed continuous string-like shape in which a straight line portion forming a long side provided in the first ceramic block 4, two straight line portions forming short sides arranged at both ends of the long side provided in the first ceramic block 4 and a straight line portion forming a long side provided in the lowest part of the first ceramic block 4 and the second ceramic block 5 are connected. In other words, the chamber 7 includes two linear regions including a linear region adjacent to the linear opening 8 (the straight line portion forming the long side provided in the lowest part of the first ceramic block 4 and the second ceramic block 5) and the linear region arranged in parallel to the above region (the straight line portion forming the long side provided in the first ceramic block 4). An inner wall surface of the annular chamber 7 forming the opening 8 is a portion where the ceramic tube 19 is exposed in a direction of the opening 8, which has a linear shape. As a distance between the substrate stage 1 or the substrate 2 and the inner wall surface of the chamber 7 is fixed in a region (near the opening 8) where the substrate 2 is irradiated with plasma, uniform processing can be performed. The chamber 7 is flat as a whole, and the opening 8 is opened by cutting part of the dielectric surrounding the chamber 7 in a straight line shape (in other words, by dividing the part in a flat plane).

The coils 3a, 3b are formed of two linear conductors arranged only along two linear regions. That is, the coils 3a, 3b are not provided along the straight line portions forming two short sides. In related-art inductively-coupled plasma torches, it is normal that helical-shaped coils are provided to surround the cylindrical chamber. That is, the coils are arranged along the entire chamber. Also in a new long-type inductively-coupled plasma torch (line-shaped plasma processing is realized) disclosed in Non-Patent Document 1, the coils are disposed along the entire chamber. In the chamber having two long sides and two short sides as in the embodiment, desired plasma can be obtained only by arranging coils only along the long sides which are longer regions. It is difficult to arrange the coil inside the cylinder in the helical-shaped or the spiral-shaped coil in related art, however, there is a great advantage that the coil can be arranged inside a rotating cylinder as the coil has the linear shape as explained in the embodiment. The high-frequency powers of opposite directions (opposite phases) are applied to the coils 3a and 3b along the longitudinal direction of the opening 8 as shown in FIG. 8. Though the case where one high-frequency power source 25 is divided is cited as an example, two high-frequency power sources may be synchronously operated by appropriately using a phase shifter. As the coils 3a and 3b form a parallel circuit, there are advantages that a combined inductance is reduced and that a required drive voltage is low. Copper bars 24 as connecting portions which are continued from the coil 3a in a perpendicular direction are provided at both ends of the coil 3a, thereby electrically connecting the coil to the outside. On the other hand, the coil 3b penetrates through the ceramic tube 19 to be electrically connected to the outside through a rotating conductive mechanism formed of a brush or a rotary connector.

The plasma P generated in the chamber 7 is jetted from the plasma jetting port which forms the lowest part of the chamber 7 (the linear-shaped opening 8 forming the long side provided in the lowest part of the first ceramic block 4 and the second ceramic block 5) toward the substrate 2. The longitudinal direction of the chamber 7 and the longitudinal direction of the opening 8 are arranged in parallel.

The rectangular groove provided in the first ceramic block 4 is the first gas manifold 9. The gas supplied from the first gas supply pipe 10 to the first gas manifold 9 is introduced into the chamber 7 through the first gas supply hole 11 as the gas introducing part 11 positioned between the groove provided in the first ceramic block 4 and a flat portion of the second ceramic block 5. According to the structure, the gas flow which is uniform in the longitudinal direction can be easily realized. The flow rate of the gas to be introduced into the first gas supply pipe 10 is controlled by providing the flow rate controller such as the mass flow controller on the upstream side thereof.

The gas supplied by three second gas supply pipes 20 passes a space between the ceramic tube 19 and the first ceramic block 4/the second ceramic block 5 through gas introducing grooves 21 as gas introducing parts provided in the second ceramic block 5 to be introduced in the vicinity of the opening 8. Flow rates of the gas introduced to respective second gas supply pipes 20 are respectively controlled by providing flow rate controllers such as mass flow controllers on the upstream side thereof. The gas flows through a space between three concave portions 22 provided in the ceramic tube 19 as shown in FIG. 9 and the first ceramic block 4 and the second ceramic block 5 as dielectric members supporting the ceramic tube 19. In a region 23 between the concave portion 22 and the concave portion 22, a diameter of the ceramic tube 19 is slightly larger than that of the concave portion 22. The ceramic tube 19 does not contact the first ceramic block 4 and the second ceramic block 5 (the ceramic tube 19 contacts a not-shown bearing) when the ceramic tube 19 rotates, therefore, the gas is communicated also to the region 23 between the concave portion 22 and the concave portion 22, however, the distribution of flow rates in the three gas passages can be controlled by designing the device so that the conductance of the concave portion 22 is sufficiently higher than the conductance of the region 23 between the concave portion 22 and the concave portion 22.

In the above structure, portions where a gap between the first ceramic block 4 and the second ceramic block 5 is widened toward the opening 8 at a lower part of the concave portions 22 correspond to gas jetting ports 29 from which the gas is jetted from the inductively-coupled plasma torch unit T toward the substrate stage 1. That is, plural gas jetting ports 29 from which the gas is jetted toward the substrate stage 1 are arranged side by side in the direction of the line formed by the opening 8 in the vicinity of the opening 8. As shown in FIG. 5A, the gas jetting ports 29 have a structure in which the gas is jetted from both sides of the interposed opening 8 toward an obliquely lower part, having an advantage of pushing the plasma P downward while keeping the plasma P at the center of the opening 8. The gas introducing grooves 21 are arranged in positions opposite to the opening 8 (above the ceramic tube 19 in FIG. 5A), therefore, the gas passes one concave portion 22 and is jetted from the gas jetting ports 29 on both sides almost uniformly, which is especially effective for keeping the plasma P in the center of the opening 8. That is, the plasma P easily remains at the center of the opening 8 in the right and left direction in FIG. 5A. Because the plasma P is pushed toward the substrate 2, the plasma P goes away from the ceramic members (the first ceramic block 4, the second ceramic block 5 and the ceramic tube 19) in the vicinity of the opening 8, therefore, the dielectric members are hardly damaged even when the high power is supplied, which can realize plasma processing capable of performing high-speed processing. Also because of the above structure the plasma P comes closer to the substrate 2. Therefore, the surface of the substrate 2 can be processed with a higher temperature even when being operated with the same power, which can realize plasma processing capable of performing high-speed processing.

The cylindrical ceramic tube 19 is provided between the first ceramic block 4 and the second ceramic block 5, and an upper surface of the lowest part of the chamber 7 is formed of the ceramic tube 19. That is, a portion forming the surface which faces the substrate stage 1 in the dielectric member surrounding the chamber 7 is formed of a cylinder arranged in parallel to the line direction of the opening 8. A rotating mechanism for rotating the ceramic tube 19 around the axis thereof is also provided. The ceramic tube 19 is a tube having a hollow thereinside, in which the inside hollow functions as the water conduit 6 through which a coolant can flow.

The linear coil 3b is provided along the axis of the cylinder inside the rotating cylindrical ceramic tube 19. The arrangement can reduce a distance between the coil 3b and the straight line portion of the chamber 7 communicating with the opening 8 and adjacent to the opening 8. That is, the arrangement in which the distance between the coil 3b and the chamber 7 is close can be realized. This contributes to the improvement of plasma generation efficiency. That is, high-speed and effective plasma processing can be realized.

As can be seen from FIG. 6 and FIG. 7, the generated plasma P will have a shape similar to an outer edge of a solid formed by two rectangles having the same length as the length of the opening 8 in the line direction are adhered in an L-shape. The reason why the plasma P has a slightly distorted shape is that if is necessary to arrange the chamber 7 so as not to interfere with the ceramic tube 19.

The high-frequency power is supplied to the coils 3a, 3b from the high-frequency power source 25 while supplying the gas into the chamber 7 in advance and while jetting the gas from the opening 8 toward the substrate 2, thereby generating the plasma P in the chamber 7, and plasma processing can be performed on the substrate 2 by irradiating the substrate 2 with the plasma P from the opening 8. The substrate 2 is processed by relatively moving the chamber 7 and the substrate stage 1 in a perpendicular direction with respect to the line direction (longitudinal direction) of the opening 8. That is, the inductively-coupled plasma torch unit T or the substrate stage 1 is moved in the right and left direction of FIG. 5A.

When the distance between the inductively-coupled plasma torch unit T and the substrate 2 is reduced for processing the substrate 2 efficiently, the inner wall surface of the portion opposite to the substrate stage 1 (portion facing the substrate stage 1) in the chamber 7 near the substrate stage 1 receives the largest quantity of heat. Therefore, it is necessary to cool the portion effectively for suppressing damage. Accordingly, the structure in which the ceramic tube 19 having the water conduit 6 there inside is used in the embodiment. As the ceramic tube 19 is formed in the cylindrical shape, the high strength can be secured and an inner water pressure can be increased, as a result, a larger quantity of cooling water is allowed to flow. Moreover, the surface receiving heat from the plasma P is constantly changed by rotating the ceramic tube 19. That is, a portion having a high temperature after receiving heat from the plasma P quickly moves to a position not receiving heat from the plasma P by rotation and rapidly cooled. Therefore, drastically higher high-frequency power can be applied as compared with related art, and high-speed plasma processing can be performed.

As described above, the higher high-frequency power can be inputted according to the embodiment. That is, when performing high-temperature heat treatment on the vicinity of the substrate surface just for a short period of time or when performing low-temperature plasma processing on the substrate by irradiating the substrate with plasma generated by a reactant gas or with plasma and the reactant gas flow at the same time, high-speed processing can be performed as well as plasma can be stably utilized. That is, as the device can be operated with the high power, irradiation intensity of plasma can be increased, as a result, processing speed (the number of substrates which can be processed per a unit time) is increased.

Various types of gasses may be used as the gas to be supplied into the chamber 7, however, gases mainly containing an inert gas are desirable in consideration of the stability and ignitability of plasma and lifetimes of members exposed to plasma. Among them, Ar gas is typically used. When plasma is generated only by Ar gas, the plasma will be quite high in temperature (10,000K or more). Plasma with a further higher temperature can be obtained by adding a slight amount of $H_2$ gas.

As conditions for generating plasma, the following values are approximately suitable: a scanning speed=50 to 3000 mm/s; the total gas flow rate=1 to 100 SLM; an $H_2$ concentration in Ar+$H_2$ gas=0 to 10%; and the high-frequency power=0.5 to 50 kW. In these various amounts, values per a length 100 mm of the opening 8 are shown about the gas flow rate and the power. That is because it is suitable that amounts in proportion to the length of the opening 8 are inputted in parameters such as the gas flow rate and the power.

In the structure according to the embodiment in which the plural gas jetting ports 29 from which the gas is jetted toward the substrate stage 1 are provided in the vicinity of the opening 8 side by side in the direction of the line formed by the opening 8, the gas flow rates jetted from respective gas jetting ports 29 are controlled independently of one another by flow rate controllers such as mass flow controllers in respective systems. Therefore, the distribution of heating performances (amounts of heat influx to the substrate) in the direction of the line formed by the opening 8 can be controlled and the plasma processing device with excellent uniformity can be realized.

In the embodiment, the first gas supply pipe 10 for introducing the gas toward a portion other than the opening 8 in the chamber 7 is provided separately from the second gas supply pipes 20 for introducing the gas to plural gas jetting ports 29. Although the introduced gas is easily diffused from a gap between the inductively-coupled plasma torch unit T and the substrate 2 in the vicinity of the opening 8, the gas introduced into the chamber 7 from the first gas supply pipe 10 through the first gas manifold 9 and the first gas supply hole 11 flows from an upper part to a lower part in FIG. 5A inside the chamber 7, then, reaches a space between the inductively-coupled plasma torch unit T and the substrate 2 near both sides of the opening 8. As described above, the flowing manner of the gas differs in a path through which the gas is introduced to the plural gas jetting ports and a path through which the gas is introduced to the portion other than the opening 8 in the chamber 7. Accordingly, the plasma can be generated more stably by providing different gas supply paths respectively and controlling the flow rates of these paths independently as in the embodiment.

Embodiment 4

Hereinafter, Embodiment 4 of the present disclosure will be explained with reference to FIG. 10 to FIG. 11.

Figure 10:
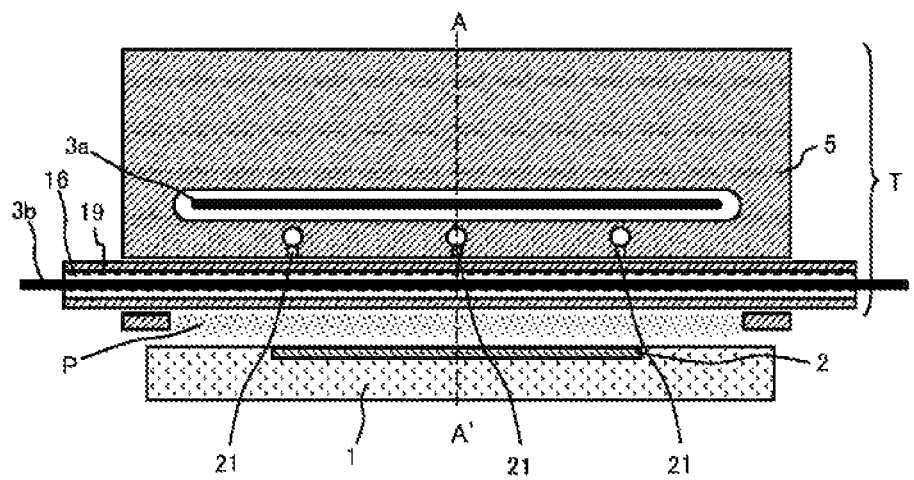
FIG. 10 is a cross-sectional view showing a structure of a plasma processing device according to Embodiment 4 of the present disclosure.
Figure 11:
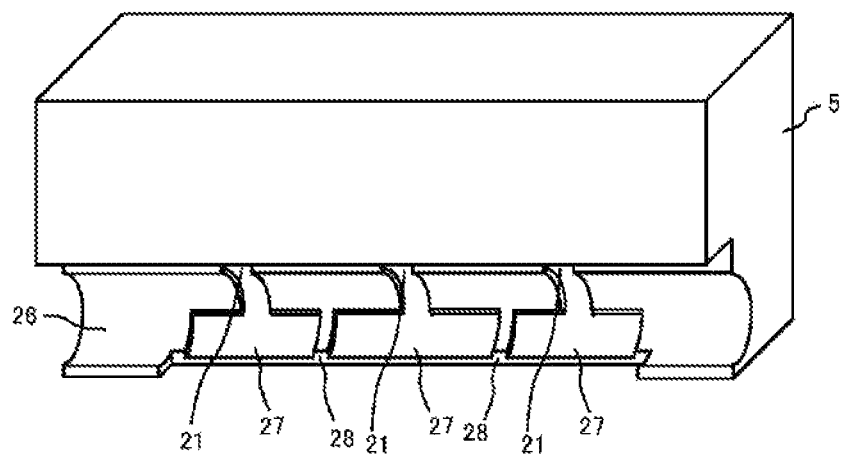
FIG. 11 is a perspective view showing a structure of a second ceramic according to Embodiment 4 of the present disclosure.

FIG. 10 shows a structure of a plasma processing device according to Embodiment 4 of the present disclosure, which is a cross-sectional view taken in parallel to the direction of the line formed by the opening 8 as well as along a dotted line C-C' shown in FIG. 5A in the inductively-coupled plasma torch unit T, which corresponds to FIG. 5C of Embodiment 1. FIG. 11 is a perspective view showing the structure of the second ceramic block 5, which is a view obtained by seeing an obliquely lower direction from the right front of FIG. 10.

As shown in FIG. 10, the concave portions 22 in Embodiment 3 are not provided in the ceramic tube 19 in the embodiment. Instead of that, a structure in which the gas flows through a space between the ceramic tube 19 and concave portions 27 provided in an inner wall surface 26 of a cylindrical through hole supporting the ceramic tube 19 in the first ceramic block 4 and the second ceramic block 5 as dielectric members supporting the ceramic tube 19 is adopted as shown in FIG. 11. A diameter of the inner wall surface 26 of the cylindrical through hole supporting the ceramic tube 19 in regions 28 between the concave portion 27 and the concave portion 27 is slightly narrower than a diameter of the concave portions 27. The ceramic tube 19 does not contact the first ceramic block 4 and the second ceramic block 5 (the ceramic tube 19 contacts a not-shown bearing) when the ceramic tube 19 rotates, therefore, the gas is communicated also to the region 28 between the concave portion 27 and the concave portion 27, however, the distribution of flow rates in the three gas passages can be controlled by designing the device so that the conductance of the concave portion 27 is sufficiently higher than the conductance of the region 28 between the concave portion 27 and the concave portion 27.

As the diameter of the ceramic tube 19 differs according to places in Embodiment 1, the distance between the substrate 2 and the ceramic tube 19 is not strictly constant in the line direction, and processing unevenness may occur. On the other hand, the diameter of the ceramic tube 19 is constant in the embodiment, the distance between the substrate 2 and the ceramic tube 19 is constant in the line direction, therefore, there is an advantage that processing unevenness hardly occurs. However, labor on processing of components is smaller in Embodiment 3.

In the above plasma processing devices and methods, typical examples in the application range of the present disclosure are just cited.

For example, the inductively-coupled plasma torch unit T may scan the fixed substrate stage 1 as well as the substrate stage 1 may scan the fixed inductively-coupled plasma torch unit T.

Although the substrate stage 1 for mounting the flat-plate substrate 2 is cited as an example of the substrate mounting table, the present disclosure can be applied to a method of processing a film-type substrate by using a roll-to-roll process, and a roller for holding the film or the like functions as the substrate mounting table in that case.

According to various structures of the present disclosure, the vicinity of the surface of the substrate 2 can be processed with the high temperature. Accordingly, the present disclosure can be applied to the crystallization of a semiconductor film for a TFT and the reforming of a semiconductor film for a solar cell as described in related art examples. It is naturally possible to apply the present disclosure to various surface processing such as oxidation, activation, and annealing for silicide formation of a silicon semiconductor integrated circuit, cleaning and reduction of degassing in a protective layer of a plasma display panel, surface planarization and reduction of degassing in a dielectric layer formed of an aggregate of silica fine particles, reflow of various types of electronic devices and plasma doping using a solid dopant source.

The present disclosure may be also applied to a method of manufacturing solar cells, in which powder obtained by pulverizing a silicon ingot is applied onto a substrate and is melted by being irradiated with plasma to thereby obtain a polycrystalline silicon film.

Although the term "thermal plasma" is used in the explanation for simplification, it is difficult to discriminate between the thermal plasma and the low-temperature plasma, and it is also difficult to distinguish types of plasma only by thermal equilibrium as explained in "Non-equilibrium in thermal plasma." TANAKA Yasunori, Journal of Plasma and Fusion Research, Vol. 82, No. 8 (2006), pp. 479-483. One object of the present disclosure is to perform thermal treatment on the substrate, and the present disclosure can be applied to techniques for irradiation of high-temperature plasma regardless of terms such as thermal plasma, thermal equilibrium plasma and high-temperature plasma.

As described above, two modes of a low discharge and a high discharge exist in the inductively-coupled plasma torch. The present disclosure has been made for effectively use of the high discharge.

The case where high-temperature heat treatment is performed on the vicinity of the substrate surface just for a short period of time has been cited in detail, however, the present disclosure can be applied to a case where low-temperature plasma processing is performed on the substrate by irradiating the substrate with plasma by a reactant gas or with plasma and the reactant gas flow at the same time. When the reactant gas is mixed to a plasma gas, the substrate is irradiated with plasma by the reactant gas, which can realize etching and CVD.

It is also possible to realize plasma processing such as etching, CVD and doping by irradiating the substrate with plasma and the reactant gas flow at the same time by supplying a gas containing the reactant gas as a shield gas while using a noble gas or a gas obtained by adding a small amount of $H_2$ gas to the noble gas as the plasma gas. When the gas mainly containing Argon is used as the plasma gas, thermal plasma is generated as explained in detail in the embodiments.

On the other hand, when a gas mainly containing helium is used as the plasma gas, relatively low-temperature plasma can be generated. It is possible to perform processing such as etching or film deposition by this method without heating the substrate too much. As reactant gases used for etching, halogen containing gases such as $C_xF_y$ (x, y are natural numbers) and $SF_6$ exist, which can etch silicon, silicon compounds and so on.

When using $O_2$ as the reactant gas, removal of organic matters, resist ashing and so on can be realized. As reactant gases used for CVD, monosilane, disilane and so on exist, which can perform film deposition of silicon or silicon compounds.

Alternatively, when a mixed gas of an organic gas containing silicon represented by TEOS (Tetraethoxysilane) and $O_2$ is used, a silicon oxide film can be deposited. Additionally, various types of low-temperature plasma processing such as surface processing for improving water repellency and hydrophilicity can be performed. When comparing the technique of the inductively-coupled type with related art techniques using capacitively-coupled atmospheric plasma, transition to arc discharge hardly occurs even when high power density is inputted per a unit volume, therefore, plasma with a higher density can be generated. As a result, higher reaction speed can be obtained and the entire desired region to be processed on the substrate can be processed for a short period of time efficiently.

As described above, the present disclosure can be utilized for manufacture of various types of electronic devices and can be applied to, for example, the crystallization of the semiconductor film for the TFT and the reforming of the semiconductor film for the solar cell. Naturally, the present disclosure is effective for performing high-speed processing and using plasma stably at the time of giving high-temperature heat treatment uniformly for a short period of time on the vicinity of the surface of the substrate in various surface processing such as activation annealing of semiconductor, cleaning and reduction of degassing in a protective layer of a plasma display panel, surface planarization and reduction of degassing in a dielectric layer formed of an aggregate of silica fine particles, reflow of various types of electronic devices and plasma doping using a solid dopant source.

The present disclosure is also effective for processing the entire desired region to be progressed on the substrate for a snort period of time efficiently in low-temperature plasma processing such as etching, film deposition, doping and surface reforming in the manufacture of various electronic devices and so on.

What is claimed is:

1. A plasma processing device using an inductively-coupled plasma torch comprising:
    an annular chamber having a linear-shaped opening and communicating with the opening, which is surrounded by dielectric members except for the opening;
    a gas supply pipe introducing a gas into plural gas jetting ports;
    coils provided in the vicinity of the chamber;
    a high-frequency power source connected to the coils; and
    a substrate mounting table,
    wherein the plural gas jetting ports jet the gas toward the substrate mounting table,
    wherein the plural gas jetting ports are provided side by side in a direction of a line formed by the opening in the vicinity of the opening, and
    wherein the plural gas jetting ports are divided by a plurality of partitions in the direction of the line.

2. The plasma processing device according to claim 1, further comprising:
    plural gas flow rate controllers respectively connected to the plural gas jetting ports and respectively controlling flow rates of the gas supplied to the plural gas jetting ports, wherein each of the plural gas flow rate controllers controls flow rates of the gas independently of one another.

3. The plasma processing device according to claim 1, further comprising:
    a gas supply pipe introducing the gas toward a portion other than the opening of the chamber separately from the gas supply pipe introducing the gas to the plural gas jetting ports.

4. The plasma processing device according to claim 1, wherein a portion forming a surface facing the substrate mounting table in the dielectric members surrounding the chamber is formed of a cylinder arranged in parallel to the line direction of the opening.

5. A plasma processing device using an inductively-coupled plasma torch comprising:
    an annular chamber having a linear-shaped opening and communicating with the opening, which is surrounded by dielectric members except for the opening;
    a gas supply pipe introducing a gas into plural gas jetting ports;
    coils provided in the vicinity of the chamber;
    a high-frequency power source connected to the coils; and
    a substrate mounting table, wherein:
    the plural gas jetting ports jet the gas toward the substrate mounting table;
    the plural gas jetting ports are provided side by side in a direction of a line formed by the opening in the vicinity of the opening;
    a portion forming a surface facing the substrate mounting table in the dielectric members surrounding the chamber is formed of a cylinder arranged in parallel to the line direction of the opening; and
    a rotating mechanism rotates the cylinder around an axis of the cylinder.

6. The plasma processing device according to claim 4, wherein the gas flows toward the plural gas jetting ports through spaces between concave portions provided in the cylinder and the dielectric members supporting the cylinder.

7. The plasma processing device according to claim 4, wherein the gas flows toward the plural gas jetting ports through spaces between the cylinder and concave portions provided in the dielectric member supporting the cylinder.

8. A plasma processing method using an inductively-coupled plasma torch comprising the steps of:
    jetting a gas from a linear-shaped opening communicating with an annular chamber toward a substrate while supplying the gas into the annular chamber surrounded by dielectric members;
    generating a high-frequency electromagnetic field inside the annular chamber by supplying high-frequency power to coils to generate plasma; and
    processing the surface of the substrate,
    wherein the processing is performed while jetting the gas toward a substrate mounting table from plural gas jetting ports provided side by side in a direction of a line formed by the opening in the vicinity of the opening, the plural gas jetting ports divided by a plurality of partitions in the direction of the line.

9. A manufacturing method of an electronic device which uses the plasma processing method according to claim 8.

10. The plasma processing device according to claim 1, wherein:
    the dielectric members include first and second ceramic blocks; and
    the opening includes a first surface in the first ceramic block and a second surface in the second ceramic block, both of the first and second surfaces inclined with respect to a surface formed by the substrate mounting table so that the opening has a shape widened toward the substrate mounting table.

11. The plasma processing device according to claim 1, wherein
    the dielectric members include first and second ceramic blocks; and
    the opening includes a first surface in the first ceramic block and a second surface in the second ceramic block, both of the first and second surfaces are elliptical arcs that make a semi-cylindrical shape as a whole which widens toward the substrate mounting table.

* * * * *